United States Patent [19]

Ballard

[11] Patent Number: 5,148,535
[45] Date of Patent: Sep. 15, 1992

[54] NON-BUS REQUEST REFRESH SYSTEM FOR SHORTENING REFRESH TIMING

[75] Inventor: Jerry L. Ballard, Aledo, Tex.

[73] Assignee: Tandy Corporation, Fort Worth, Tex.

[21] Appl. No.: 401,343

[22] Filed: Aug. 31, 1989

[51] Int. Cl.$^5$ .................... G06F 13/14; G06F 12/00; G11C 8/00
[52] U.S. Cl. .................... 395/425; 365/222; 365/230.08
[58] Field of Search ............... 365/222, 230.08, 233

[56] References Cited

U.S. PATENT DOCUMENTS

| | | | |
|---|---|---|---|
| 4,649,511 | 3/1987 | Gdula | 365/233 X |
| 4,884,234 | 11/1989 | Keys et al. | 365/222 X |
| 4,924,381 | 5/1990 | Tokume | 365/222 X |
| 4,956,820 | 9/1990 | Hashimoto | 365/222 |

Primary Examiner—Alyssa H. Bowler
Attorney, Agent, or Firm—Townsend and Townsend

[57] ABSTRACT

A system for refreshing dynamic random access memory that does not request the bus from the CPU prior to performing a refresh operation. The system initiates a refresh operation when the end of a CPU bus cycle is signalled and stores status and address data if the CPU initiates a new CPU bus cycle prior to the completion of the refresh operation.

3 Claims, 4 Drawing Sheets

NON-BUS REQUEST REFRESH SYSTEM FOR SHORTENING REFRESH TIMING

BACKGROUND OF THE INVENTION

1. Field of the Invention

The present invention relates generally to digital computers having memory and I/O including dynamic memory and, more particularly, relates to a system for reducing the time required to refresh the dynamic memory.

2. Description of the Prior Art

An important characteristic of dynamic memory is the requirement of periodically refreshing the memory to preserve the data stored. This refreshing operation must take precedence over all other operations or important data will be irretrievably lost.

Generally the transfer of data between a CPU and memory or I/O occurs during a CPU bus cycle initiated by the CPU and controlled by a separate BUS CONTROLLER. Also, a separate timer functions to generate a refresh request signal at specified intervals determined by the refresh requirements of the dynamic memory. In PC type computers, a refresh system requests the bus from the CPU and puts the CPU in a wait state while the refresh operation is completed. In a PC-XT type of computer, the refresh interval is about 15 microseconds. One row of memory is refreshed every refresh interval.

Typical refresh systems utilize a DMA controller so that cycles required for arbitration are utilized in addition to the cycles required to refresh the memory. A standard PC-XT using the standard refresh system consumes about 2.5 microseconds or about 17% of each refresh interval. A PC-AT type computer also extends the time consumed for refresh by requiring extra cycles for arbitration.

Thus, the standard refresh system significantly reduces the usable portion of the CPU cycle time and decreases the effective speed of the computer.

SUMMARY OF THE INVENTION

The present invention is a refresh system and method that does not request the bus from the CPU. A first signal indicating the end of a CPU bus cycle is monitored and the refresh operation is initiated when a CPU bus cycle terminates.

According to one aspect of the invention, if a new CPU bus cycle is initiated while the refresh operation is in progress the status and address signals generated by the CPU are stored. The stored status signal is transferred to the bus controller upon completion of the refresh operation to start a delayed bus cycle. The state of the first signal is controlled so that a new CPU bus cycle is not started until the delayed CPU bus cycle is completed.

The invention reduces the unavailability of the bus to the minimum time actually required to perform the refresh operation.

Other features and advantages will be apparent in view of the appended drawings and following detailed description.

DETAILED DESCRIPTION OF THE PREFERRED EMBODIMENTS

Figure 1:
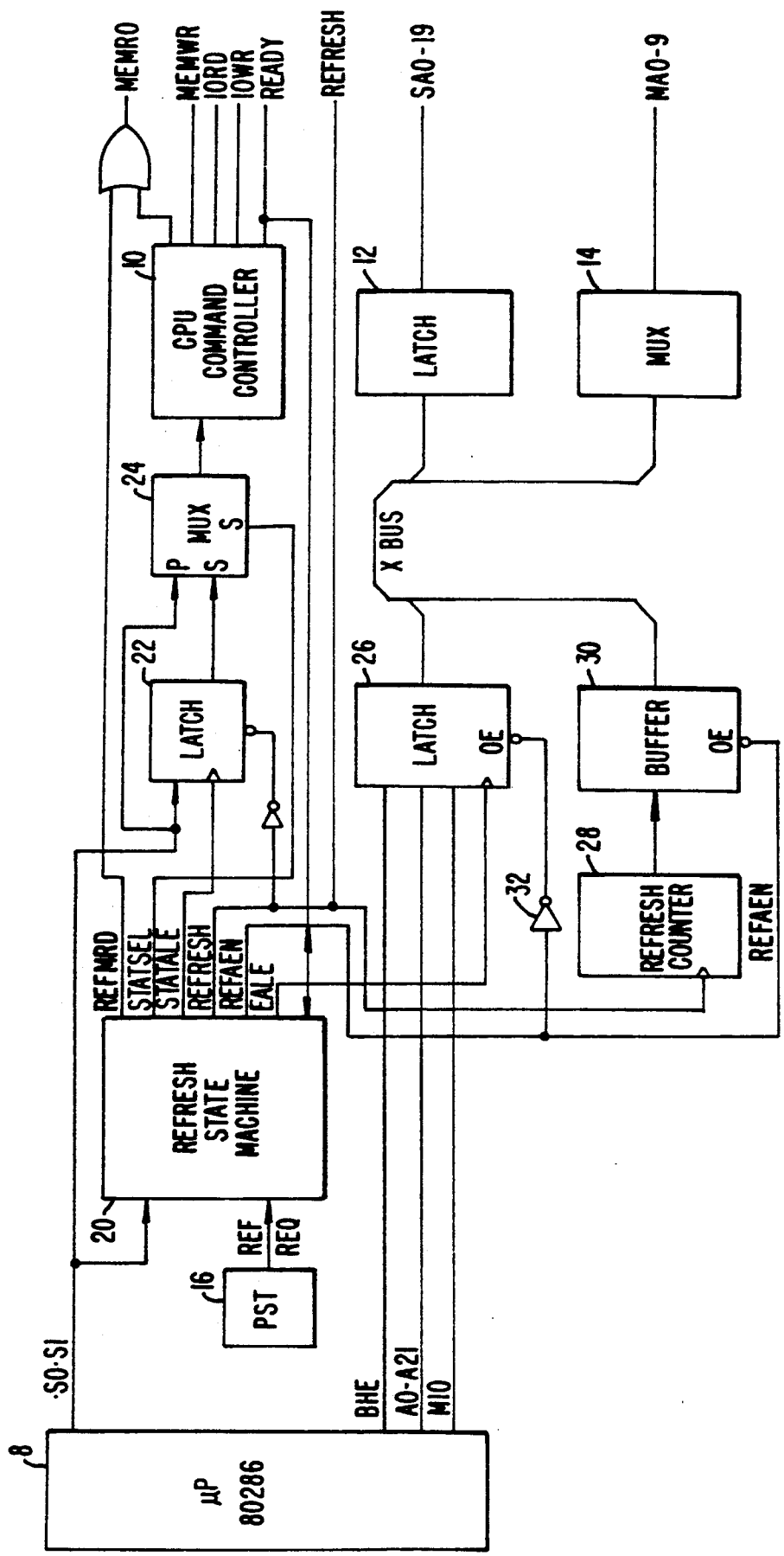
FIG. 1 is a block diagram of a preferred embodiment of the invention.

FIG. 1 is a block diagram of an embodiment of the invention. The operation of this embodiment will be described referring the timing of level transitions of several signals. The symbols utilized to describe these signal and descriptions of the signals are presented in the following table:

| SIGNAL NAME | SIGNAL DESCRIPTION |
| --- | --- |
| S0,S1 | Status Bits |
| BHE | Bus High Enable |
| A0-A21 | Address Bits |
| MIO | Memory I/O |
| MEMRD | Memory Read |
| MEMWR | Memory Write |
| IORD | I/O Read |
| IOWR | I/O Write |
| READY | Ready |
| REFREQ | Refresh Request |
| REFMRD | Refresh Memory Read |
| STATSEL | State Machine Select |
| STATALE | State Machine Address Latch Enable |
| REFRESH | Refresh |
| REFAEN | Refresh Address Latch Enable |
| EALE | E Address Latch Enable |

In FIG. 1, several elements are standard parts included in the bus and bus control system of PC type computers utilizing a microprocessor CPU 8, such as an INTEL 80286 having S0, S1, BHE, A0-14 A21, and MIO signal outputs. The CPU COMMAND BUS CONTROLLER 10, such as an INTEL model 82288, receives the S0, S1 signals, generates the MEMWR, IORD, and IOWR signal, and includes logic for pulling the READY signal low when a CPU bus cycle is completed. The address latch 12, row/column address mux 14, and programmable interval timer (PIT) 16 which sets REFREQ are standard PC-XT components utilized by the present system.

A unique REFRESH STATE MACHINE 20 has inputs for receiving the REFREQ signal asserted by the PIT 16, the status bits S0, S1 generated by the CPU 8. and the READY signal set by the ready logic. The REFRESH STATE MACHINE 20 includes REFMRD. STATSEL. STATALE, EALE, REFRESH, REFAEN, and READY output ports. The REFRESH STATE MACHINE 20 receives the READY signal asserted by the READY logic and also has the capability to prevent the READY signal form being pulled low by the READY logic.

A REF LATCH 22 receives S0, S1 at its data input and STATALE at is clock input and a REF MUX 22 has a first data input that receives S0, S1 directly from the CPU 8, a second data input that receives the output from the REF LATCH 22, and a select input that receives STATSEL.

An E ADR LATCH 26 receives the BHE, A0-A21, and MIO signals from the microprocessor CPU 8 at it data inputs and the EALE signal at its clock input, the REF COUNTER 28, receives refresh signal at is start input, and a REF ADR BUFFER 30 receives the REF COUNTER count signal at its data input. The output enable (OE) input of the REF ADR BUFFER 30 receives the REFAEN signal, the OE input of the E ADR LATCH, and the OE input of the REF LATCH 22 receive the REFAEN signal inverted by an invertor 32.

Figure 2:
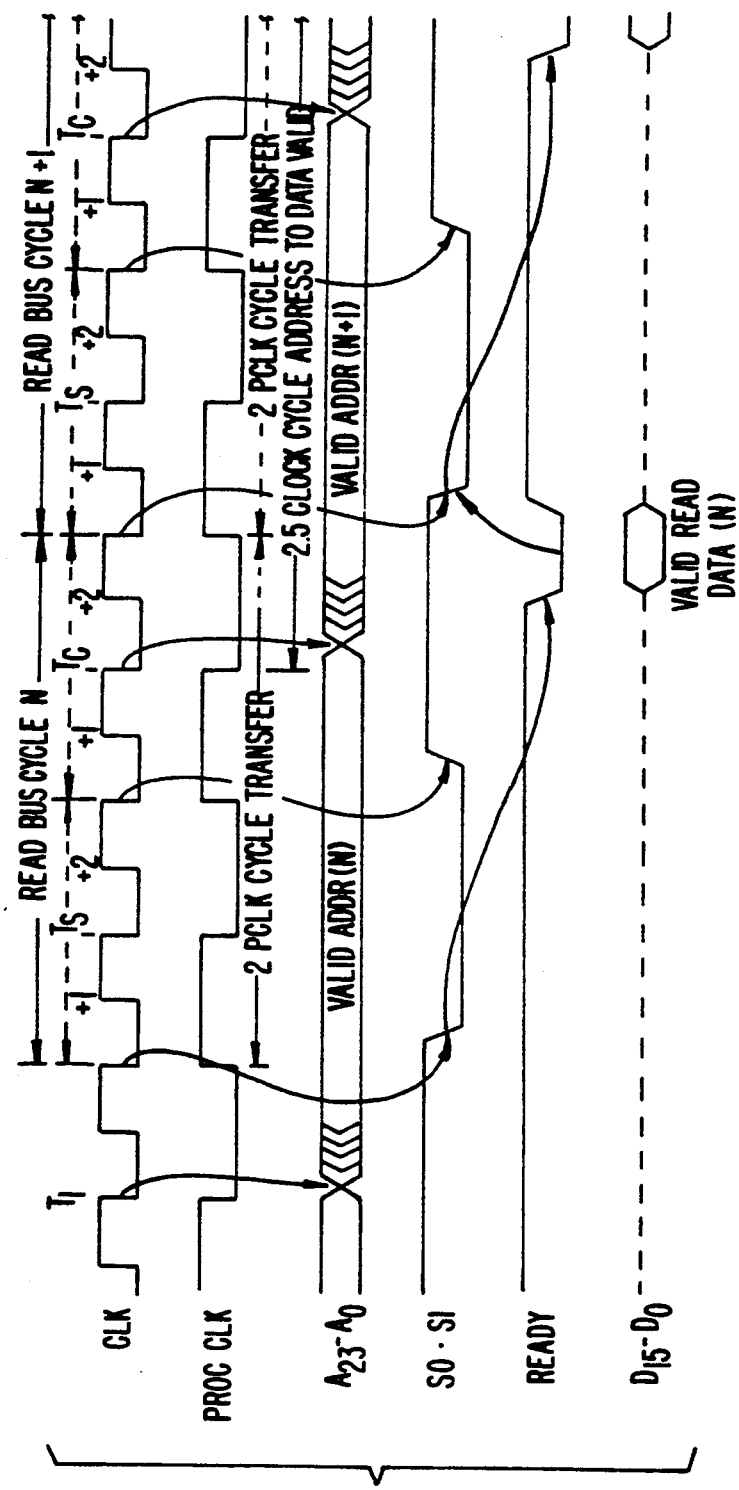
FIG. 2 is a timing diagram depicting a illustrating CPU bus cycle.

FIG. 2 is a diagram of the CPU bus cycle. The details of the bus cycle are well known in the art and only those features relevant to the present invention are described. Referring now to FIG. 2, the clock cycle is divided into T-states. The first state is a Ts state which is signalled by the S0, S1 signal going low. During the Ts state the address signals and, for a write operation, data signals are generated by the microprocessor CPU 8. Subsequent to each Ts state, at least one command state (Tc) is automatically generated. During Tc the memory or I/O device either transfer read data to the microprocessor CPU 8 or accept write data. The Tc states are repeated until the READY signal is reset and goes low. Thus, for slow memory or I/O the bus cycle can be extended by delaying the READY transition from high to low. This READY signal transition signals the end of the current bus cycle.

The standard refresh cycle requires the use of the bus for a time interval of four T states and prevents the use of the CPU during this interval.

Figure 3:
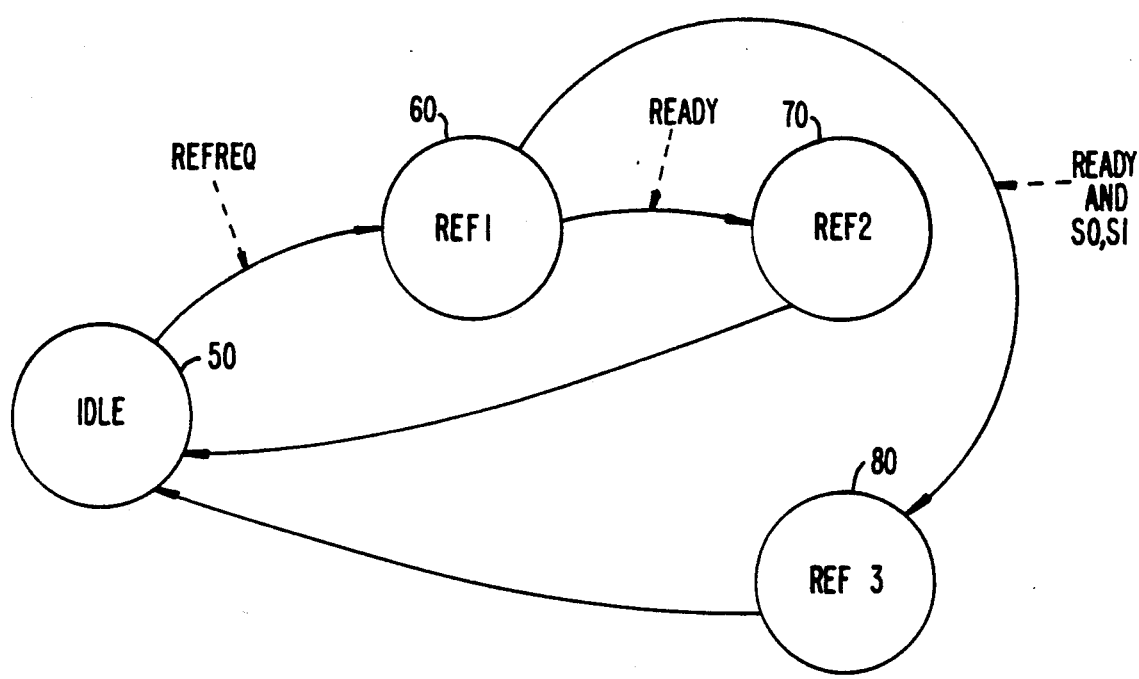
FIG. 3 is a state diagram illustrating the operation of the embodiment of FIG. 1.
Figure 4:
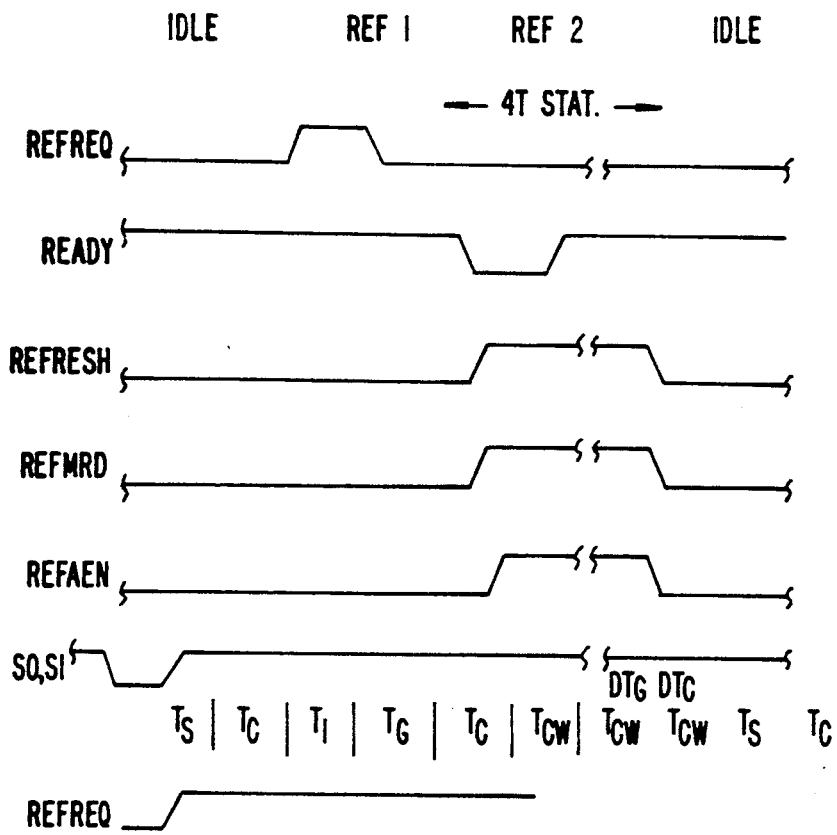
FIGS. 4 and 5 are timing diagrams illustrating the operation of the embodiment of FIG. 1.
Figure 5:
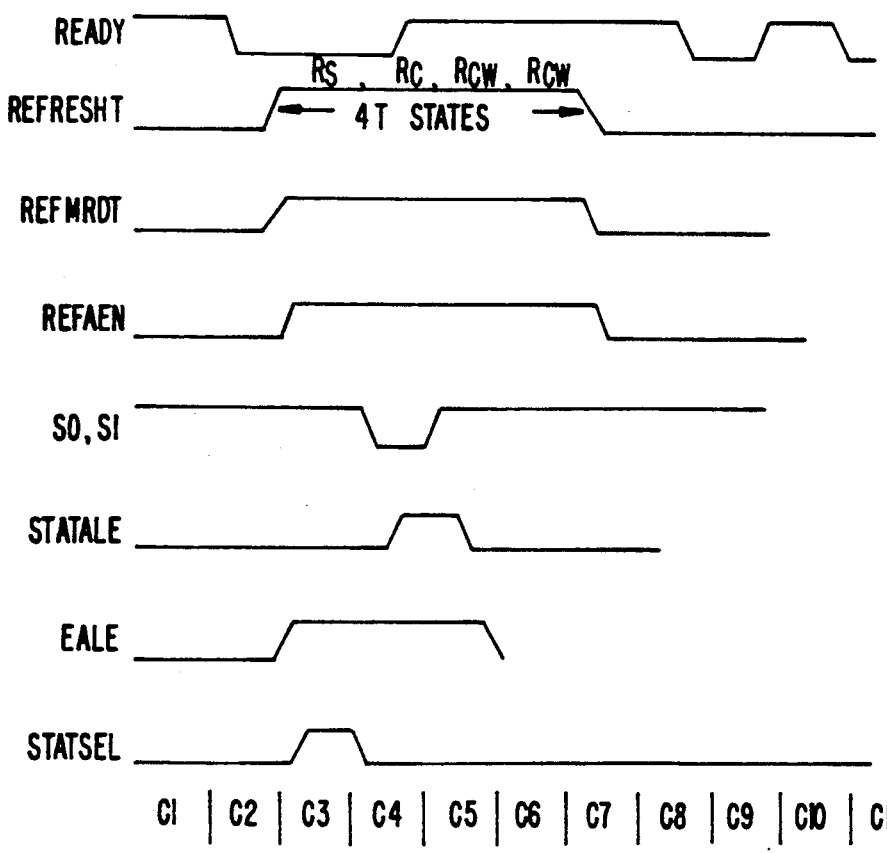

FIG. 3 is a state diagram where the labeled circles indicate the various states of the REFRESH STATE MACHINE 20, the solid arrows indicate transitions between the states, and the dotted arrows are labelled by the signal that causes a state transition. FIGS. 4 and 5 are timing diagrams depicting the signal transitions that occur during state transitions and the timing thereof.

The operation of the system of FIG. 1 will now be described with reference to FIGS. 1-5. The transition from the IDLE STATE 50 to the REF1 STATE 60 is caused by the low to high transition of REFREQ. The REFRESH STATE MACHINE then monitors READY to determine the end of a CPU bus cycle and makes the transition to the REF2 STATE 70.

FIG. 4 illustrates the timing of the refresh operation if the CPU 8 does not assert S0, S1 to request the bus during the refresh operation. During the REF2 STATE. after READY is reset. REFRESH. REFMRD. and REFAEN are set to increment the refresh counter 28 to generate the next row address required for the refresh operation, to provide the required READ signal to the DRAMS being refreshed, and to enable the refresh buffer 30 to drive the refresh address generated by the refresh counter 28 respectively. If the CPU 8 does not initiate another CPU bus cycle, then the transition from the REF2 STATE 70 to the IDLE STATE 50 occurs after the four T-states required to refresh the addressed memory row. No CPU time has been wasted because the refresh cycle was tagged on the end of a CPU bus cycle and completed before the CPU initiates a cycle. The REFRESH, REFMRD, and REFAEN signals are then reset and the state machine enters the IDLE STATE 50.

FIG. 6 depicts the state of the signals when the CPU 8 requests the bus during the REF2 STATE before the completion of the refresh operation. In FIG. 6 the refresh operation occurs during T-states C3 to C6. The assertion of S0, S1, ADR 0-21, and MIO by the CPU 8 at cycle C4 indicates the beginning of a new CPU bus cycle. The REFRESH STATE MACHINE 20 detects the assertion of S0, S1 and makes the transition from the REF2 STATE 70 to the REF3 STATE 80 at T-state C4.

As described above, the assertion of the status bits S0, S1 signals the beginning of a Ts state where status and address data are output from the CPU 8. During the REF3 STATE 80. STATALE is set, after a required set-up time, to latch S0, S1 into the REF LATCH 22, EALE is set, after a required set-up time, to latch A0-A21. BHE and MIO into the E LATCH 26, and STATSEL is set to couple the second input of REF MUX 24 to the BUS CONTROLLER 10. Note that REFAEN is set during T-states C5 and C6 of the REF3 STATE 80 so that the outputs of the REF LATCH 22 and E LATCH 26 are not enabled and their outputs are in the high impedance state. Thus, the latched status, control, and address data for the newly initiated CPU bus is not transferred to the BC 10 or buses until the refresh operation is completed.

At T-state C6 the refresh operation is complete and a delayed CPU cycle is initiated. When REFAEN is reset at T-state C7 the latched status data is transferred form the REF LATCH 22 to the BUS CONTROLLER 10 and the latched A0-A21, BHE, and MIO data are transferred from the E LATCH 6 to the ADDRESS LATCH 12.

Subsequently, the BC 10 responds to the latched S0, S1 signals to generate the required control signals to complete the CPU bus cycle that was initiated during the REF3 STATE 80.

The READY signal is held high by the REFRESH STATE MACHINE 20 during cycles C7 and C8 to prevent the CPU 8 from initiating a new cycle until the delayed cycle is completed, the transition to the IDLE STATE 50 occurs when READY is reset.

Thus, the present system reduces the bus availability only by the amount of time actually required by the refresh operation and achieves a substantial reduction of the amount of time the bus is unavailable to the CPU. For a T-state of 125 nanosecond duration, the refresh operation requires the bus for only 5 microseconds.

The invention has now been described with reference to the preferred embodiments. The control signals generated by the REFRESH STATE MACHINE 20 are derived from standard control signals generated by the CPU and other hardware in a PC-XT type of computer. The particular digital circuitry required to implement the timing of the control signals generated by the REFRESH STATE MACHINE includes gates, flip-flops, and other circuitry which is standard and not part of the invention. Persons of ordinary skill in the art, apprised of the information disclosed herein, may implement such digital circuitry in various ways. Accordingly, the invention is not intended to be limited except as provided by the appended claims.

What is claimed is:

1. In a computer including a CPU, a bus, a bus controller, one or more address signals, and a memory, where data is transferred between the CPU and memory via the bus during a CPU bus cycle, and where the beginning of the CPU bus cycle and type of CPU bus cycle is signalled by the CPU asserting a status signal which is transferred to the bus controller and the end of the CPU bus cycle is signalled by resetting a first signal, and where the requirement of a memory refersh operation is signalled by setting a second signal, first latching means coupled to said status signal and said bus controller for latching and transferring said status signal to said bus controller, and second latching means coupled to said address signals and said bus controller for latching and transferring said address signals to said bus controller, an improved method for refershing memory comprising the steps of:

detecting the setting of the second signal when a memory refreshing memory comprising the steps of:
  detecting the setting of the second signal when a memory refresh operation is required;
  starting a memory refresh operation when the first signal is reset, to indicate that a CPU bus cycle has been completed, subsequent to the detection of the setting of said second signal;
  detecting the assertion of the status signal during said started memory refresh operation if the CPU initiates a new CPU bus cycle during said started refresh operation;
  latching the status signal in the first latching means after a first interval subsequent to the detection of the assertion of the status signal;
  latching the address signals in the second latching means after a second interval subsequent to the detection of the assertion of the status signal;
  transferring said latched status and address signals to the bus controller when said started refresh operation is completed to start a delayed CPU bus cycle; and
  delaying the resetting of said first signal until said started refresh operation and said delayed CPU bus cycle is completed.

2. The system as set forth in claim 1, wherein the step of latching the address signals is performed after the step of latching the status signal.

3. In a computer including a CPU, a bus, a bus controller having a status signal input, a memory address latch, and a memory, where data is transferred between the CPU and memory via the bus during a CPU bus cycle, and where the beginning of the CPU bus cycle and type of CPU bus cycle is signalled by the CPU asserting a status signal which is transferred to the bus controller and address signals which are transferred to the memory address latch and the end of the CPU bus cycle is signalled by resetting a first signal, and where the requirement of a memory refresh operation is signalled by setting a second signal, an improved system for refreshing memory comprising:

a first latch having a data input that receives the status signal from the CPU, a latch input that receives a first latch signal, an output enable input that receives an output enable signal, and a data output, said first latch for latching said received status signal when said first latch signal is set and for outputting said latched status signal when said output enable signal is reset;
  a multiplexer having a first input for receiving the status signals from the CPU, a second input coupled to the data output of said first latch, a select input for receiving a select signal and an output that couples the bus controller status signal input to the first input when said select signal is reset and to the second input when said select signal is set:
  a second latch having a data input that receives the address signals from the CPU, a latch input that receives a second latch signal, an output enable input that receives an output enable signal, and a data output, said second latch for latching said received address signals when said second latch signal is set and for outputting said latched address signals when said output enable signal is reset;
  means, having an output enable input that receives said output enable signal, for providing a refresh address when said output enable signal is set;
  means for setting said output enable signal and for setting said select signal to start a refresh operation when said first signal is set subsequent to the setting of said second signal:
  means for setting said first and second latch signals to store the status and latch signals if the CPU asserts the status signals during said refresh operation to signal the beginning of a new CPU bus cycle;
  means for resetting said output enable signal when said started refresh operation is finished to transfer said latched status signal to the bus controller and said latched address signals to the address latch to start a delayed CPU bus cycle: and
  means for delaying resetting said third signal until said refresh operation and said delayed CPU bus cycle are completed.

* * * * *